Oct. 20, 1970 J. P. CHIDESTER 3,535,655
RESONANT PHASE SHIFT OSCILLATOR FOR A SERIES RESONANT LOAD UTILIZING FULL LOAD CURRENT AS OSCILLATOR FEEDBACK
Filed Sept. 26, 1968

JOSEPH P. CHIDESTER
INVENTOR

BY William G. Christoforo
ATTORNEY

United States Patent Office 3,535,655
Patented Oct. 20, 1970

3,535,655

RESONANT PHASE SHIFT OSCILLATOR FOR A SERIES RESONANT LOAD UTILIZING FULL LOAD CURRENT AS OSCILLATOR FEEDBACK

Joseph P. Chidester, Monkton, Md., assignor to The Bendix Corporation, a corporation of Delaware Filed Sept. 26, 1968, Ser. No. 762,856
Int. Cl. H01v 7/00
U.S. Cl. 331—116 10 Claims

ABSTRACT OF THE DISCLOSURE

A resonant phase shift oscillator for a crystal load operating essentially at resonance where in full load current is used to control a transistor switching circuit which supplies at the input terminal of a phase shifting network a squarewave voltage at the load resonant frequency. The phase shifting network, which has a resonant frequency equal to the load resonant frequency at a predetermined loading, shifts the phase of the voltage applied to its input terminal by 180°. This phase shifted voltage is then applied to the load. Q of the load is characteristically very high, while Q of the phase shifting network is designed to be very much less.

BACKGROUND OF THE INVENTION

This invention relates to phase shift oscillators and particularly to phase shift oscillators suitable for use as a driving means for a series resonant load, such as a piezoelectric crystal transducer, whose resonant frequency varies with loading.

When an alternating voltage of relatively high frequency, typically in the ultrasonic range, is applied across a crystal transducer, the crystal will be cyclically thickened and thinned so as to be lengthened and shortened. A tool may be physically attached to the crystal, thereby allowing the tool to move with the crystal so that it may be used to perform useful work.

A crystal transducer of this type is characterized by a figure of merit usually desinated Q. Q represents the ratio of energy stored in the crystal to the energy lost therein or therefrom during one cycle of operation of the transducer. In a crystal transducer of the type which might suitably be used in the phase shift oscillator to be described, the figure of merit might be as high as 2000. This relatively high Q signifies that the crystal has a sharp resonant peak, that is, that the voltage frequency from the power supply oscillator must lie in a relatively narrow band about the resonant frequency of the crystal in order to obtain optimized crystal power output. It is also well known that as the crystal is loaded, such as by varying the work load on the tool attached to the crystal, the resonant frequency of the crystal will shift, so that as the tool is loaded, if the frequency of the driving oscillator remains constant, the power output of the crystal transducer will be drastically curtailed. Thus, to maintain a constant power output from the crystal transducer it is necessary to retune the oscillator to the new resonant load frequency in response to the changing load conditions. This retuning of the oscillator is best performed automatically by using the crystal load as the final frequency determining element in the oscillator circuitry.

SUMMARY OF THE INVENTION

A resonant phase shift oscillator has been devised for driving a series resonant load such as a crystal wherein full load current is used to control oscillator frequency. In this oscillator a low voltage squarewave generator, suitably a transistorized switching circuit, generates a squarewave in synchronism with crystal load current. The squarewave is fed into a resonant phase shift network which filters the squarewave harmonics, steps up the voltage of the fundamental frequency, and shifts the fundamental phase in such a way that the load current controlling the switching circuitry causes the voltage square wave to be generated at the resonant frequency of the load and in proper phase relationship therewith. Should the load characteristics change so that the load resonant frequency changes, the phase shift introduced by the phase shifting network remains relatively constant due to its designed low Q characteristic response thus maintaining nearly constant load power.

It is thus an object of this invention to provide an electronic phase shift oscillator suitable for driving a series resonant load having a relatively high Q.

It is another object of this invention to provide a phase shift oscillator of the type described, wherein full load current is used as oscillator feedback.

It is still another object of this invention to provide an electronic phase shift oscillator for driving a crystal transducer wherein the oscillator output frequency is determined by the loading on the transducer.

One further object of this invention is to provide a resonant phase shift oscillator of the type described wherein the load comprises the frequency determining element of the oscillator.

These and other objects of this invention will become apparent to one skilled in the art by a reading and comprehension of the following description of the preferred embodiment and claims.

DESCRIPTION OF THE PREFERRED EMBODIMENT

Figure 1:
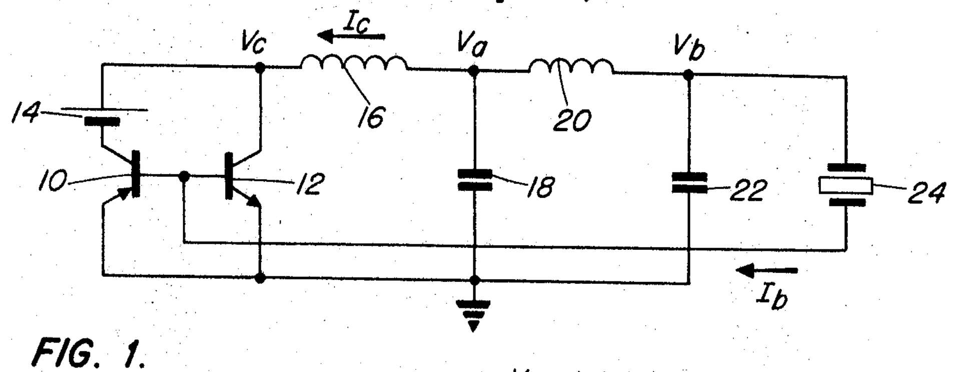
FIG. 1 is a schematic of the embodiment of the invention.
Figure 2:
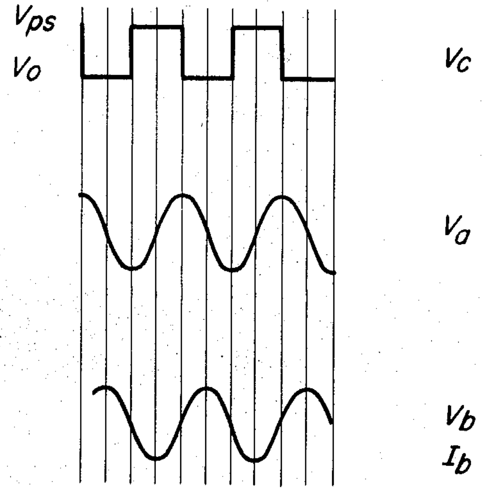
FIG. 2 shows waveforms of voltage and current at various points in the circuitry of FIG. 1.

Referring to FIG. 1, an electronic switching circuit comprised of transistors 10 and 12 in response to oscillation of the load current $I_b$ generates a voltage squarewave, $V_c$, at the collector of transistor 12. Referring now also to FIG. 2, the voltage squareware $V_c$ is seen to vary from a maximum, $V_{ps}$, which is the voltage output of power supply 14, and $V_o$. The voltage squarewave drives through the phase shifting network comprised of inductors 16 and 20 and capacitors 18 and 22 which shifts the phase of voltage $V_b$ 180° with respect to voltage $V_c$, along with filtering the squarewave harmonics contained in $V_c$, in the following manner as long as resonant frequency of the load equals the resonant frequency of the phase shifting network. Inductor 16 shifts the voltage $V_c$ 90° while capacitor 18 filters the voltage squarewave harmonics so that the voltage waveform $V_a$ is generally sinusoidal shifted by 90° as seen in FIG. 2. Similarly, inductor 20 and capacitor 22 shift and filter the waveform $V_a$ so as to generate the waveform $V_b$ again shown in FIG. 2. Assuming now that the waveform $V_b$ is oscillating at the resonant frequency of load 24, the load current $I_b$ is in phase therewith and has a waveform similar to $V_b$. When $I_b$ is positive, as shown, transistor 12 is conductive thus essentially grounding the collector of transistor 12 so that $I_c$ is positive as shown in FIG. 1. When the load current reverses $I_b$ is negative and transistor 10 becomes conductive. Transistor 12 turns off so that $V_c$ is equal to $V_{ps}$ and the current $I_c$ is negative. Thus, as long as the resonant frequency of the phase shifting network is equal to the resonant frequency of the load, the oscillator frequency remains at the resonant frequency of the load.

It will be remembered tht a crystal transducer of the type used in this circuitry can have a Q as high as 2000.

Figure 3:
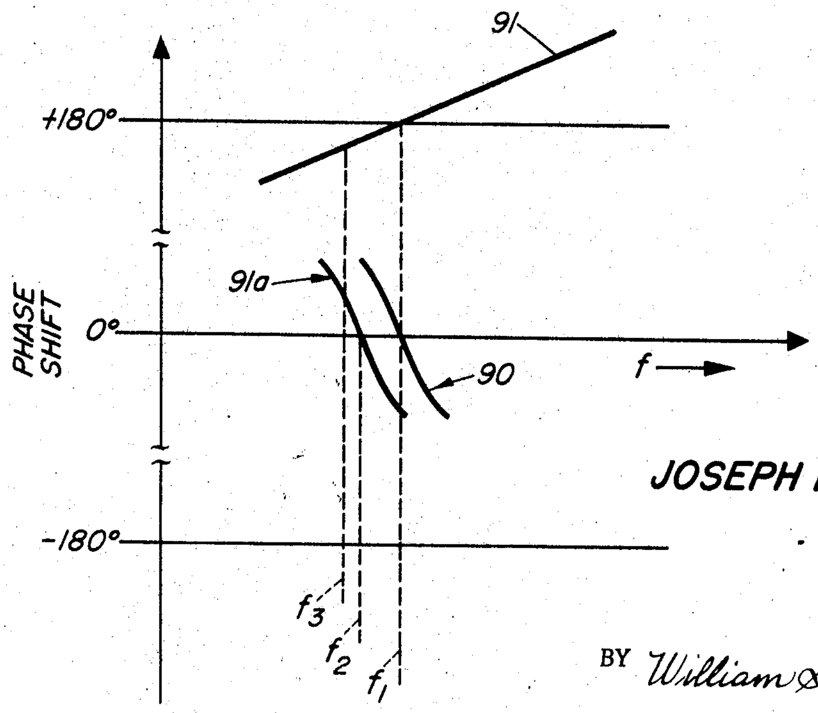
FIG. 3 is a graph of phase shift versus frequency for typical high and low Q circuits.

The Q of the phase shift network is designed to be much lower than this, generally in the neighborhood of 10. With this in mind, refer to FIG. 3 where curve 90 shows the phase shift of the current flow through a high Q device such as the crystal transducer described at a predetermined load versus frequency while curve 91 shows the corresponding characteristic phase shift for a low Q circuit such as the phase shift network of this invention. It should be particularly noted that for a high Q device the phase shifts sharply as the frequency varies from the resonant frequency while for the low Q circuit the phase shifts much less over the same frequency range. If the load now changed, the crystal phase shift characteristic curve will move to a new position, for example, to new curve 91*a*. The crystal resonant frequency thus shifts from $f_1$ to $f_2$ while the resonant frequency of the phase shifting network remains $f_1$, its design resonant frequency. Not, that while crystal resonant frequency is $f_1$, the phase shift network contributes 180° of phase shift while the crystal contributes no phase shift since it is at resonance. With the crystal now loaded so as to resonate at $f_2$, the entire system will change its mode of operation so as to oscillate at a new frequency where the sum of the phase shifts contributed by the crystal and the phase shifting network is once again equal to 180°. This new frequency will be neither $f_1$ nor $f_2$ but will be $f_3$ as shown in FIG. 3. Moreover, since the phase shift supplied by the phase shift network varies only slightly with frequency changes, the crystal typically need only contribute a few degrees of phase shift. Additionally, since crystal phase shift changes sharply as the crystal moves off resonance, the required crystal phase shift will be satisfied at a frequency very close to crystal resonant frequency. Consequently, the system remains in oscillation at very nearly the resonant frequency of the crystal even though the crystal loading changes.

There is a voltage step-up of the voltage $V_c$ to $V_b$ such that $$V_b = kV_c$$

where $k$=Q of the phase shifting network.

Since $I_b$ is in phase with $V_b$, the power delivered to the load is $V_b \times I_b$.

Additionally, since $I_c$ is in phase with $V_c$ the power supplied to the entire system is $V_c \times I_c$. If the losses in the phase shift network are neglected, it can be seen that $V_c \times I_c$ is approximately equal to $V_b \times I_b$. Also, since $V_b = kV_c$, then $I_c$ is approximately equal to $kI_b$. $I_c$, however, is equal to $\beta I_b$ where $\beta$ is the current gain of transistors 10 and 12. Therefore for the oscillator to function it is necessary that the $\beta$ of the transistors be at least equal to the Q of the phase shifting network.

Having thus described the preferred embodiment of my invention, I hereby claim the subject matter including modifications and alterations thereof encompassed by the true scope and spirit of the appended claims.

The invention claimed is:

1. A resonant phase shift oscillator comprising:
- a series resonant load characterized by a figure of merit $Q_2$ and through which flows a load current;
- a voltage wave generator responsive to said load current for generating a voltage wave;
- a phase shifting network characterized by a figure of merit $Q_1$ and having a predetermined resonant frequency for shifting the phase of said voltage wave by 180°, and for increasing the magnitude of said voltage wave by a factor equal to said $Q_1$ said phase shifted voltage wave being applied to said load, and wherein $Q_2$ of said load is very much higher than $Q_1$ of said phase shifting network and said predetermined resonant frequency of said phase shifting network is equal to the resonant frequency of said phase shifting network is equal to the resonant frequency of said load at a predetermined loading.

2. A resonant phase shift oscillator as recited in claim 1 wherein said voltage wave generator comprises a square wave voltage generator responsive to said load current for generating a square voltage wave and said phase shifting network includes additionally means for filtering the square wave harmonics from said square voltage wave network.

3. A resonant phase shift oscillator as recited in claim 2 wherein said square wave voltage generator comprises a transistorized switching circuit responsive to said load current including a D.C. voltage source and an output terminal connected to deliver said generated square voltage wave to said phase shifting network.

4. A resonant phase shift oscillator as recited in claim 2 wherein said square wave generator comprises:
- first transistor means having first base, emitter and collector terminals and including a D.C. voltage source connected in its emitter-collector circuit and a first output terminal;
- second transistor having second base, emitter and collector terminals and a second output terminal; and wherein said first and second base terminals are commonly connected to receive said load current and said first and second transistor means are oppositely conductive, said first and second output terminals being commonly connected to deliver said square voltage wave to said phase shift network.

5. A resonant phase shift oscillator as recited in claim 4 wherein said first and second base terminals are commonly connected to receive the full said load current.

6. A resonant phase shift oscillator as recited in claim 5 wherein said series resonant load comprises a piezoelectric crystal transducer.

7. A resonant phase shift oscillator as recited in claim 2 wherein said square wave voltage generator comprises:
- a first terminal;
- a second terminal;
- a first transistor having a first base terminal and an emitter-collector circuit connected across said first and second terminals;
- a D.C. voltage source;
- a second transistor having a second base terminal and an emitter-collector circuit serially connected with said D.C. voltage source across said first and second terminals, said first and second base terminals being commonly connected; and wherein said phase shifting network includes:
- an input terminal connected to said first terminal;
- an output terminal;
- a third terminal connected to said second terminal; and wherein said load includes:
- a first load terminal connected to said phase shifting network output terminal; and
- a second load terminal connected to said commonly connected base terminals.

8. A resonant phase shift oscillator as recited in claim 7 wherein said phase shifting network comprises:
- inductor means serially connected between said input and output terminals; and,
- capacitor means connected between said inductor means and said third terminal.

9. A resonant phase shift oscillator as recited in claim 8 wherein said load comprises a piezoelectric crystal transducer.

10. A resonant phase shift oscillator as recited in claim 9 with additionally mechanical means connected to said crystal transducer for performing mechanical work.

References Cited

UNITED STATES PATENTS 2,683,810 7/1954 Mortley ---------- 331—158

JOHN KOMINSKI, Primary Examiner

U.S. Cl. X.R.

310—8.1; 318—114; 331—158